(12) United States Patent
Wang et al.

(10) Patent No.: US 8,044,586 B2
(45) Date of Patent: Oct. 25, 2011

(54) ORGANIC LIGHT EMITTING DISPLAY DEVICE

(75) Inventors: Chan Hee Wang, Yongin-si (KR); Yoon Chan Oh, Yongin-si (KR); Dae Ho Lim, Yongin-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 712 days.

(21) Appl. No.: 11/670,351

(22) Filed: Feb. 1, 2007

(65) Prior Publication Data

US 2008/0074022 A1    Mar. 27, 2008

(30) Foreign Application Priority Data

Sep. 21, 2006    (KR) .................. 10-2006-0091834

(51) Int. Cl.
    *H01J 1/62* (2006.01)
(52) U.S. Cl. ...................... 313/512; 313/498
(58) Field of Classification Search ........... 313/504–512
    See application file for complete search history.

(56) References Cited

U.S. PATENT DOCUMENTS

| | | | |
|---|---|---|---|
| 2,758,772 A | 8/1956 | Williams | |
| 4,767,965 A | 8/1988 | Yamano et al. | |
| 6,149,053 A | 11/2000 | Chatterton et al. | |
| 6,288,489 B1 | 9/2001 | Isohata et al. | |
| 6,462,803 B2 | 10/2002 | Kumagai et al. | |
| 6,555,025 B1 | 4/2003 | Krupetsky et al. | |
| 6,801,268 B2 | 10/2004 | Huang et al. | |
| 6,817,917 B1 | 11/2004 | Kado et al. | |
| 6,998,776 B2 | 2/2006 | Aitken et al. | |
| 7,217,027 B2 | 5/2007 | Jung et al. | |
| 2001/0035931 A1 | 11/2001 | Kumagai et al. | |
| 2002/0105605 A1 | 8/2002 | Huang et al. | |
| 2004/0207314 A1 | 10/2004 | Aitken et al. | |
| 2005/0140844 A1 | 6/2005 | Won | |
| 2005/0151895 A1 | 7/2005 | Fukuyoshi et al. | |
| 2005/0231659 A1 | 10/2005 | Lee | |
| 2005/0233885 A1 | 10/2005 | Yoshida et al. | |
| 2005/0259191 A1 | 11/2005 | Park et al. | |
| 2005/0270800 A1 | 12/2005 | Kim et al. | |
| 2006/0023139 A1 | 2/2006 | Chen | |
| 2006/0033412 A1 | 2/2006 | Lee | |

(Continued)

FOREIGN PATENT DOCUMENTS

CN    1319243    10/2001

(Continued)

OTHER PUBLICATIONS

Examination Report issued on Jul. 9, 2008 in corresponding European patent application No. 07252454.9 in 3 pages.

(Continued)

*Primary Examiner* — Joseph L Williams
(74) *Attorney, Agent, or Firm* — Knobbe Martens Olson & Bear LLP (57) ABSTRACT

Disclosed is an organic light emitting display device including a bezel for protecting an organic light emitting display panel. The organic light emitting display device has a display panel including a first substrate, on which a pixel array having at least one organic light emitting diode is formed, a second substrate for encapsulating a pixel region of the first substrate, and an encapsulating material formed between the first substrate and the second substrate. The device further includes a bezel for receiving the display panel. The bezel accommodates the display panel and includes a lower plate with a waved surface and a sidewall extending from edges of the lower surface.

21 Claims, 8 Drawing Sheets

U.S. PATENT DOCUMENTS

| | | |
|---|---|---|
| 2006/0056202 A1 | 3/2006 | Jung et al. |
| 2006/0072051 A1 | 4/2006 | Kang et al. |
| 2006/0133018 A1 | 6/2006 | Okuda |
| 2006/0158897 A1 | 7/2006 | Choi et al. |
| 2006/0205446 A1 | 9/2006 | Lee et al. |
| 2008/0067933 A1 | 3/2008 | Wang et al. |
| 2008/0074036 A1 | 3/2008 | Wang et al. |

FOREIGN PATENT DOCUMENTS

| | | | |
|---|---|---|---|
| CN | 1758103 A | | 4/2006 |
| EP | 1460471 | | 9/2004 |
| EP | 1 659 632 A1 | | 5/2006 |
| EP | 159632 | | 5/2006 |
| JP | 2-264217 | | 10/1990 |
| JP | 10-074583 | | 3/1998 |
| JP | 11 231329 | | 8/1999 |
| JP | 11-272182 | | 10/1999 |
| JP | 2000 181373 | | 6/2000 |
| JP | 2001 126866 | | 5/2001 |
| JP | 2001 242792 | | 9/2001 |
| JP | 2001-290434 | | 10/2001 |
| JP | 2002 099218 | | 4/2002 |
| JP | 2002-215051 | | 7/2002 |
| JP | 2002-215051 A | | 7/2002 |
| JP | 2003 202550 | | 7/2003 |
| JP | 2004-309699 | | 11/2004 |
| JP | 2005 017483 | | 1/2005 |
| JP | 2005 024961 | | 1/2005 |
| JP | 2005 051083 | | 6/2005 |
| JP | 2005 141194 | | 6/2005 |
| JP | 2005-276581 A | | 10/2005 |
| JP | 2006 053532 | | 2/2006 |
| JP | 2006 080067 | | 3/2006 |
| JP | 2006 108065 | | 4/2006 |
| JP | 2006 146174 | | 6/2006 |
| JP | 2006-156361 | | 6/2006 |
| JP | 2006 202746 | | 8/2006 |
| JP | 2006 244808 | | 9/2006 |
| JP | 2006 244809 | | 9/2006 |
| JP | 2006 524419 | | 11/2006 |
| KR | 10-2004-0086607 A | | 10/2004 |
| KR | 10-2005-0003512 A | | 1/2005 |
| KR | 10 2005 0070543 | | 7/2005 |
| KR | 10-2006-0039658 A | | 5/2006 |
| KR | 10-2006-0039659 A | | 5/2006 |
| KR | 10-2006-0056811 A | | 5/2006 |
| KR | 10-2006-0085181 A | | 7/2006 |
| KR | 10 2006 0039659 | | 9/2006 |
| TW | 540553 | | 7/2003 |
| WO | WO 03 005774 A1 | | 1/2003 |
| WO | WO 2004 095597 | | 11/2004 |

OTHER PUBLICATIONS

Office Action Issued on Oct. 10, 2008 in Corresponding Chinese Patent Application No. 2007100794542 and its English Translation in 27 pages.

EPO Examination Report issued on Feb. 24, 2009 in corresponding European Patent Application No. 07 252 454.9—3 pages.

EPO Search Report regarding European Application No. 07252454.9 dated Oct. 19, 2007.

Notice of Allowance regarding Korean Application No. 10-2006-0091834 dated Sep. 21, 2007.

Office Action dated Oct. 13, 2009 of the Japan Patent Application No. 2006-197327.

Office Action dated Sep. 8, 2009 of the Japan Patent Application No. 2006-343291.

An Office Action dated Aug. 4, 2009 of the Japanese Patent Appln. No. 2006-317644.

An Office Action dated Jul. 31, 2009 of the Chinese Patent Appln. No. 2007 10089199.X.

Office Action, mailed Mar. 24, 2009 by JPO for JP Pat App 2006-299305.

Office Action, mailed Mar. 24, 2009 by JPO for JP Pat App 2006-317644.

Taiwanese Office Action dated Nov. 10, 2010 from corresponding Application No. 096105427.

Office Action from U.S. Appl. No. 11/670,330 dated Oct. 15, 2009.

Examination Report from European Patent Application No. 07252455.6 dated Jul. 9, 2008.

Search Report from European Patent Application No. 07252455.5 dated Oct. 15, 2007.

Search Report from European Patent Application No. 07252447.3 dated Oct. 19, 2007.

Bratton, W.E., et al. "Floating Subassemblies with Impact," IBM Technical Disclosure Bulletin, Jul. 1994, vol. 37, No. 07, pp. 187—188, Armonk, NY, USA.

Office Action from Chinese Patent Application No. 200710089199X dated Oct. 10, 2008.

Patent Gazette issued Apr. 6, 2011 in Chinese Patent Application No. 200710079454.2.

ORGANIC LIGHT EMITTING DISPLAY DEVICE

CROSS-REFERENCE TO RELATED APPLICATIONS

This application claims the benefit of Korean Patent Application No. 10-2006-0091834, filed on Sep. 21, 2006, in the Korean Intellectual Property Office, the disclosure of which is incorporated herein by reference in its entirety. This application is related to and incorporates herein by reference the entire contents of the following concurrently filed applications:

| Title | Atty. Docket No. | Filing Date | Application No. |
|---|---|---|---|
| ORGANIC LIGHT-EMITTING DISPLAY | SMDSHN.083AUS | Feb. 01, 2007 | 11/670,330 |
| ORGANIC LIGHT EMITTING DISPLAY | SMDSHN.086AUS | Feb. 01, 2007 | 11/670,356 |

BACKGROUND

1. Field of the Invention

The present invention relates to an organic light-emitting display device, and more particularly, to a structure accommodating a display panel.

2. Discussion of Related Technology

An organic light-emitting display panel is one of the flat panel display devices in which an organic light emitting layer is arranged between electrodes faced with each other, electrons injected through an electrode and holes injected through another electrode are recombined in the organic light emitting layer to be light emitting molecules, the light emitting molecules are excited and returned to the ground state, thus emitting light. The organic light emitting display panel has attracted attention as a next generation display, since it has an excellent visibility, can be fabricated in a light weight and in a thin thickness and also can be driven at a low voltage. The display panel is generally accommodated in a bezel or frame The discussion in this section is to provide general background information, and does not constitute an admission of prior art.

SUMMARY

One aspect of the invention provides an organic light emitting display device, which may comprise; a display panel comprising a first substrate, a second substrate, and an array of organic light emitting pixels interposed between the first and second substrates, wherein the first substrate comprises a surface; and a backing frame comprising a base plate and a plurality of side walls extending from edges of the base plate, wherein the base plate and the plurality of side walls in combination generally accommodate the display panel such that the first substrate opposes the base plate, wherein the base plate comprises a plurality of surfaces substantially opposing the surface of the first substrate, wherein the plurality of surface comprises a first surface and a second surface, wherein the first surface has a first distance to the surface of the first substrate, wherein the second surface has a second distance to the surface of the first substrate, and wherein the first and second distances are substantially different from each other.

In the foregoing device, the first and second surfaces may be substantially parallel to each other. The base plate may further comprise a connecting surface interposed between the first and second surfaces, and wherein the connecting surface is substantially perpendicular to the first and second surfaces such that the first and second surfaces form immediately neighboring surfaces. The first surface may be substantially parallel to the surface of the first substrate, wherein the second surface may not be parallel to the surface of the first substrate, and wherein the second distance may be the longest distance that the second surface has to the surface of the first substrate. The second surface may be curved. The first surface may immediately neighbor the second surface. One of the first and second surfaces may contact the first substrate. One of the first and second surfaces may be bonded to the first substrate.

Still in the foregoing device, the plurality of surfaces may further comprise a first group of surfaces and a second group of surfaces, wherein each the first group of surfaces may have a distance to the surface of the first substrate substantially same as the first distance, and wherein each of the second group of surfaces may have a distance to the surface of the first substrate substantially same as the second distance. The first and second surfaces, the first group of the surfaces and the second group of surfaces may be substantially parallel to one another. The base plate may further comprise a connecting surface interposed between one of the first group of surfaces and one of the second group of surfaces, and wherein the connecting surface is substantially perpendicular to the one of the first group of surfaces and the one of the second group of surfaces such that the one of the first group of surfaces and the one of the second group of surfaces form immediately neighboring surfaces. The first surface and the first group of surfaces may be substantially parallel to the surface of the first substrate, wherein the second surface and the second group of the surfaces may not be parallel to the surface of the first substrate, wherein the second distance may be the longest distance that the second surface has to the surface of the first substrate, and wherein the distance of each of the second group of the surfaces may be the longest distance that each of the second group of surfaces has to the surface of the first substrate. The second surface and the second group of surfaces may be curved. The first group of surfaces and the second group of surfaces may be alternately arranged.

Further in the foregoing device, the plurality of surfaces may further comprise the plurality of third surfaces, wherein each of the plurality of third surfaces may have a distance to the surface of the first substrate substantially same as the first distance, wherein the second surface may be the immediately neighboring surface of each of the plurality of third surfaces. The first and second surfaces and the plurality of third surfaces may be substantially parallel to one another. The base plate may further comprise a connecting surface, wherein the connecting surface may be interposed between the second surface and one of the plurality of third surfaces, and wherein the connecting surface may be substantially perpendicular to the second surface and the one of the plurality of third surfaces such that the second surface and the one of the plurality of third surfaces form immediately neighboring surfaces. The plurality of third surfaces may not contact the plurality of side walls. The backing frame may comprise a material selected from the group consisting of metal and polymeric resin. The plurality of side walls may comprise a first side wall opposing a side of the display panel, wherein the first side wall may comprise a first wall portion, a second wall portion and a connecting portion interconnecting the first and second wall portions, and wherein the first wall portion may be interposed between the second wall portion and the side of display panel. The device may further comprise an intervening frame comprising an intervening portion interposed between the first side wall portion and the side of the display panel.

An aspect of the present invention provides an organic light emitting display device comprising a bezel for reducing a stress applied to an organic light emitting display panel.

An aspect of the present invention provides an organic light emitting display device comprising: a display panel including a first substrate, on which a pixel array having at least one organic light emitting diode is formed, a second substrate for encapsulating a pixel region of the first substrate, and an encapsulating material formed between the first substrate and the second substrate; and a bezel for receiving the display panel, the bezel being provided on an outer surface of the display panel and including a lower surface formed with a waved surface and a sidewall extending along with an edge of the lower surface to surround the outer wall of the display panel.

BRIEF DESCRIPTION OF THE DRAWINGS

These and other aspects and advantages of the invention will become apparent and more readily appreciated from the following description of the embodiments, taken in conjunction with the accompanying drawings of which:

FIG. 2b is a sectional view depicting a lower surface cut along with a line of A-A' of FIG. 2a;

FIG. 3b is a sectional view depicting a lower surface cut along with a line of A-A' of FIG. 3a;

DETAILED DESCRIPTION OF EMBODIMENTS

Hereinafter, various embodiments of the present invention will be described in detail with reference to the accompanying drawings, in which the same elements has the same reference numerals for the sake of convenience in the following descriptions of embodiments.

Figure 1:
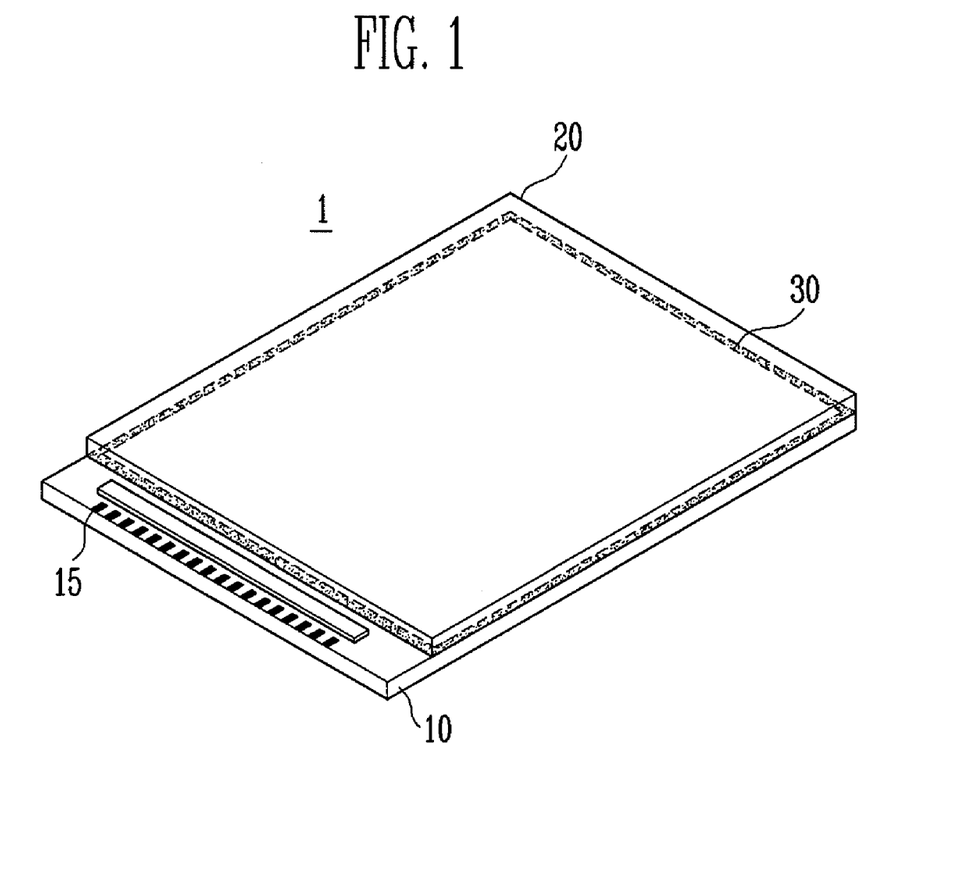
FIG. 1 is a perspective view depicting an organic light emitting display panel in accordance with an embodiment of the present invention.

FIG. 1 is a perspective view depicting an organic light emitting display panel in accordance with an embodiment of the present invention, in which a display panel 1 comprises a deposition substrate 10, an encapsulation substrate 20 and an encapsulating material 30. The deposition substrate 10 is a substrate on which a plurality of pixels that are directed to organic light emitting diodes is arranged. Each of the organic light emitting diode is composed of an anode electrode, a cathode electrode and an organic layer disposed therebetween. Pixels form an image by receiving signals from a scanning drive unit and a data drive unit through scanning lines arranged in the column direction and data lines arranged in the row direction, and include a pad section receiving external signals. Moreover, in case of an active matrix type, circuit elements such as thin film transistors connected with scanning lines, data lines or electric voltage lines are further included on the deposition substrate 10.

The encapsulation substrate 20 is a substrate that encapsulates a pixel area, in which pixels are formed on the deposition substrate 10, on the top of the deposition substrate 10 to prevent the pixels formed on the deposition substrate 10 from being exposed to moisture or oxygen and thereby damaged. The encapsulation substrate 20 is made of a transparent material in cases of a top emission and a dual emission or made of an opaque material in case of a bottom emission. Although the present invention does not limit the material of the encapsulation substrate 20, it is desirable to apply glass, for example, in case of the top emission in accordance with this embodiment. The encapsulation substrate 20 is formed in a plate shape in this embodiment.

The encapsulating material 30 is used to adhere or seal the deposition substrate 10 and the encapsulation substrate 20. The encapsulating material 30 can be made of various materials such as inorganic or organic materials. The encapsulating material 30 is formed by surrounding the pixel array. As an inorganic encapsulating material, it is possible to use a frit, for example, for intercepting the infiltration of moisture and oxygen efficiently. The frit includes at least one selected from the group consisting of $MgO$, $CaO$, $BaO$, $Li_2O$, $Na_2O$, $K_2O$, $B_2O_3$, $V_2O_5$, $ZnO$, $TeO_2$, $Al_2O_3$, $SiO_2$, $PbO$, $SnO$, $P_2O_5$, $Ru_2O$, $Rh_2O$, $Rh_2O$, $Fe_2O_3$, $CuO$, $TiO_2$, $WO_3$, $Bi_2O_3$, and $Sb_2O_3$.

Meanwhile, the display panel is received in a bezel or backing frame 40 for reinforcing the strength of the display panel and assembled in a device which needs a display. That is, the bezel 40 is connected with an outer surface of the display panel to reinforce the display panel. Especially, if the encapsulating material is an inorganic such as frit, the display panel becomes very fragile to an external impact. Accordingly, the role of the bezel 40 becomes more important.

Figure 2A:
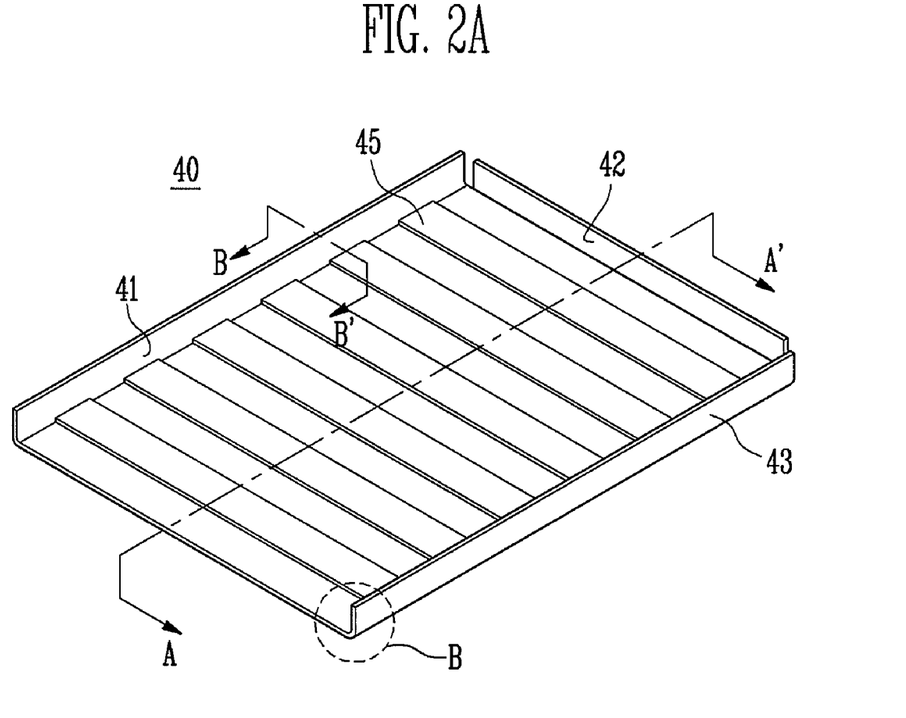
FIG. 2a is a perspective view depicting a bezel in accordance with an embodiment of the present invention.

FIG. 2a is a perspective view depicting a bezel in accordance with the embodiment of the present invention, in which the bezel 40 is shown comprising a lower surface or base plate 45 and three sidewalls 41, 42 and 43. The bezel 40 may be made of metal or plastic.

Figure 2B:
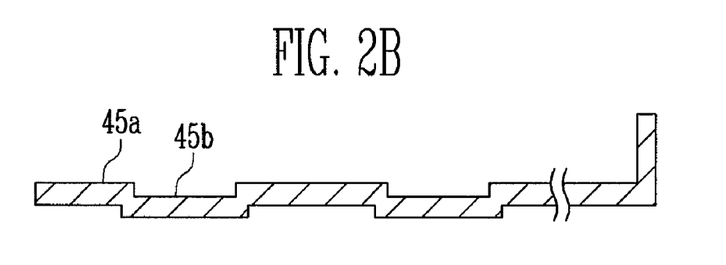
Figure 2C:
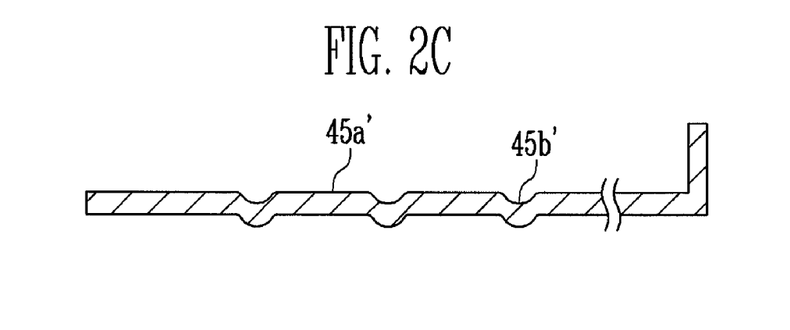
FIG. 2c is a sectional view depicting a lower surface of a bezel in accordance with an embodiment of the present invention.

When the display panel is accommodated in the lower surface 45, the lower surface 45 faces the surface of the deposition substrate 10 of the display panel 1. The base plate 45 has concave-convex surfaces or elevated and non-elevated surfaces, of which a portion protrudes or elevated toward the display panel 1, thereby enhancing the impact resistance. Here, the concave-convex surface can be embodied inside the lower surface 45 in various ways. For example, as depicted in FIG. 2b that is a sectional view taken along with a line of A-A' line of FIG. 2a, concaves 45b and convexes 45a are established in parallel by turns. The surface has a corrugated, waved or alternately arranged form. Moreover, as depicted in FIG. 2c that is a sectional view depicting a lower surface of the bezel in accordance with an embodiment of the present invention, concaves 45b' and convexes 45a' are provided inside the lower surface 45 by forming protrusions in the opposite direction to the surface where the display panel is received.

Figure 3A:
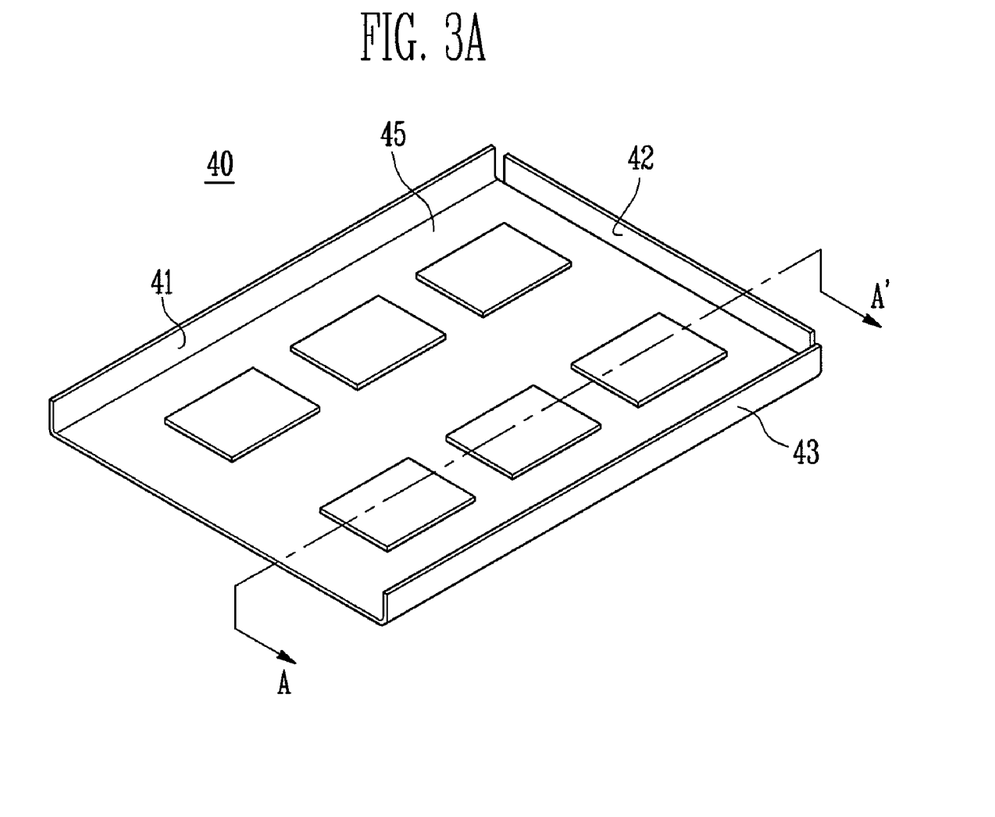
FIG. 3a is a perspective view depicting a bezel in accordance with an embodiment of the present invention.
Figure 3B:
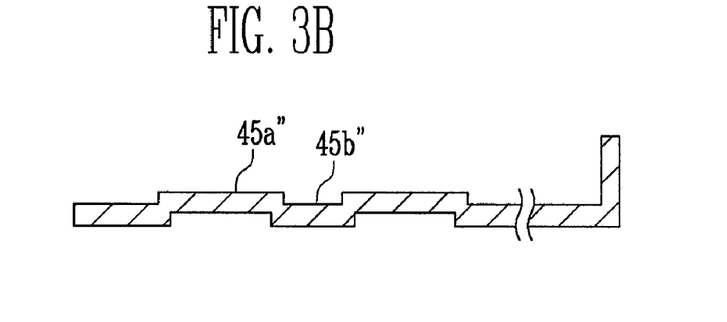

Furthermore, as depicted in FIG. 3a, it is possible to form a bezel in accordance with an embodiment of the present invention including a concave-convex surface having convexes or elevated portions 45a" of a predetermined area formed on specific portions of the bottom thereof and protruding upward. Here, the shape of the convex 45a" may be rectangular, circular, or in any other forms. FIG. 3b is a sectional view depicting a lower surface taken along with a line of A-A' of FIG. 3a. Reference numeral 45b" denotes a concave or non-elevated portion.

Referring back to FIG. 2a, the sidewalls 41, 42 and 43 protrude in the direction that the display panel is mounted along with the edges of the lower surface 45. The sidewalls 41, 42 and 43 are directed to a first sidewall 41, a second sidewall 42 and a third sidewall 43 corresponding to the respective sidewalls of the display panel. The sidewalls 41, 42 and 43 may be formed on the lower surface 45 in various ways. For example, it is possible to form the sidewalls by connecting sidewalls manufactured separately with the lower surface of the bezel or by bending the edges of a plate to be included in the bezel. Here, it is not limited to the way in which the respective sidewalls are connected with each other and formed in a body; however, it is desirable that the respective sidewall be separated with each other.

Moreover, it is possible to form the sidewalls 41, 42 and 43 with at least one wall. For example, the sidewalls may be formed in a double-wall structure having an internal wall and an external wall. The sidewalls in the double-wall structure can be formed by bending the edges of the plate to be included in the bezel twice. That is, the edge of the plate to be completed as the bezel is first bent in the direction that the display panel is located and then bent again in the opposite direction to the first bending to be into contact with each other, thus forming a double-wall, and the middle portion not bent corresponds to the lower surface.

Figure 4A:
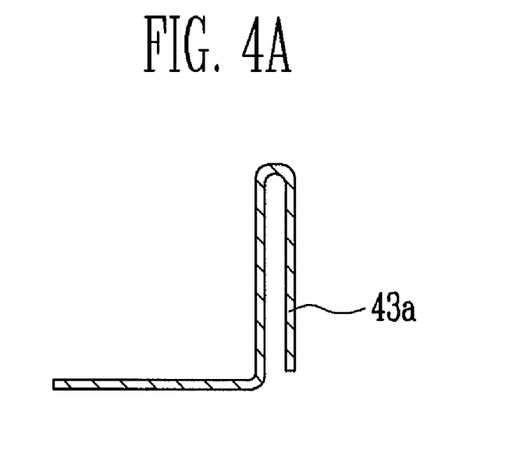
FIGS. 4a to 4f are sectional views depicting sidewalls in accordance with certain embodiments of the present invention.
Figure 4B:
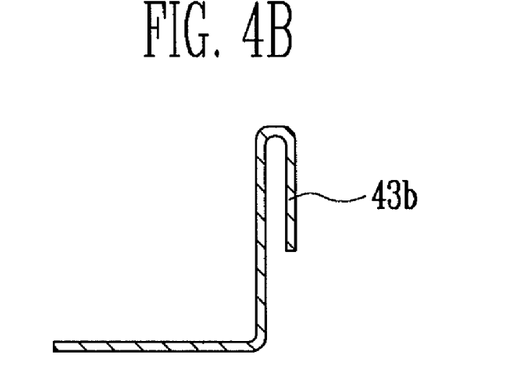
Figure 4C:
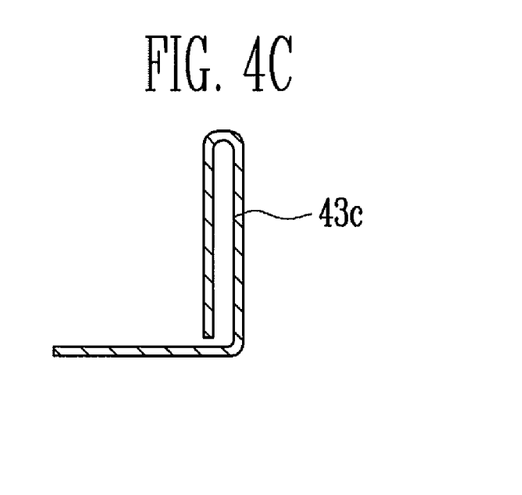
Figure 4D:
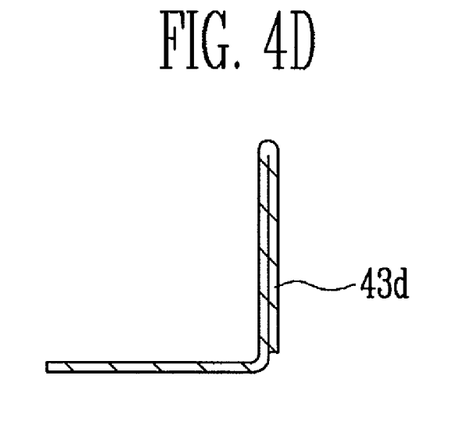
Figure 4E:
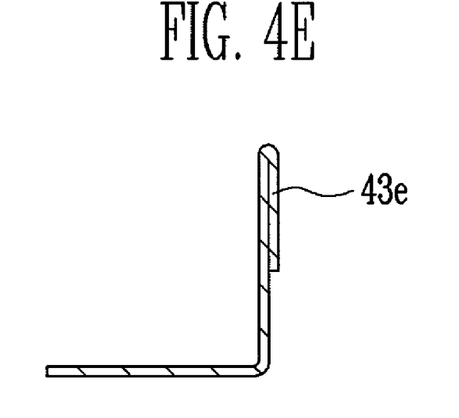
Figure 4F:
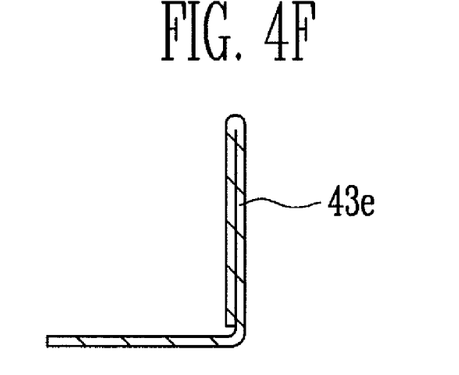

Here, the double-wall may be formed in various shapes as depicted in FIGS. 4a to 4f. As depicted in FIG. 4a, the sidewall is bent twice to the outside and extends to the bottom. As depicted in FIG. 4b, the sidewall is bent twice to the outside and extends to the middle of the height of the sidewall. As depicted in FIG. 4c, the sidewall is bent twice to the inside and extends to the bottom. Moreover, as depicted in FIGS. 4d to 4f, the outer wall and the inner wall adhere closely to each other. The sidewall of the double-wall structure creates an effect that increases the second section moment in the bezel section, thus increasing the load value applied from the test conditions of 3-axix bending or 4-axix bending of the overall module to the breakage of the display panel.

Figure 5A:
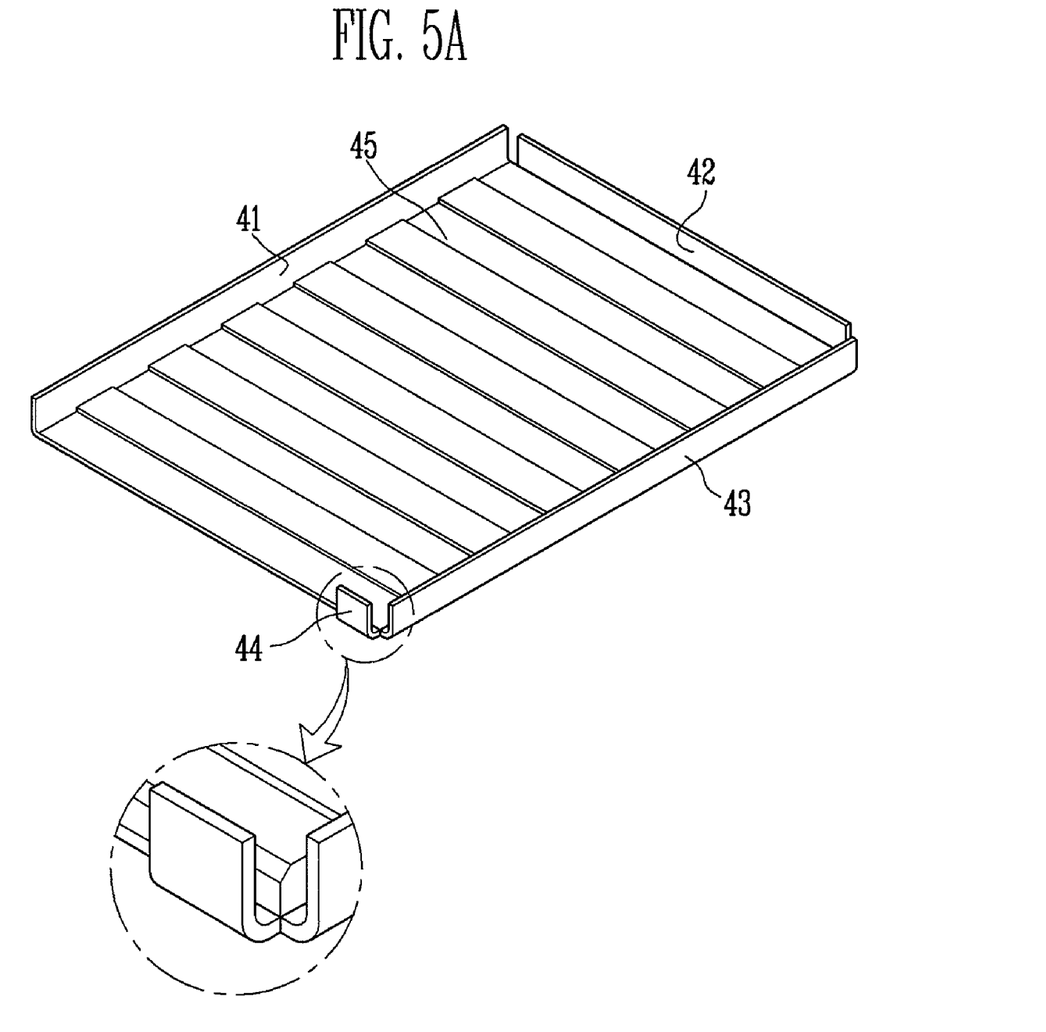
FIG. 5a is a perspective view depicting a bezel in accordance with an embodiment of the present invention.
Figure 5B:
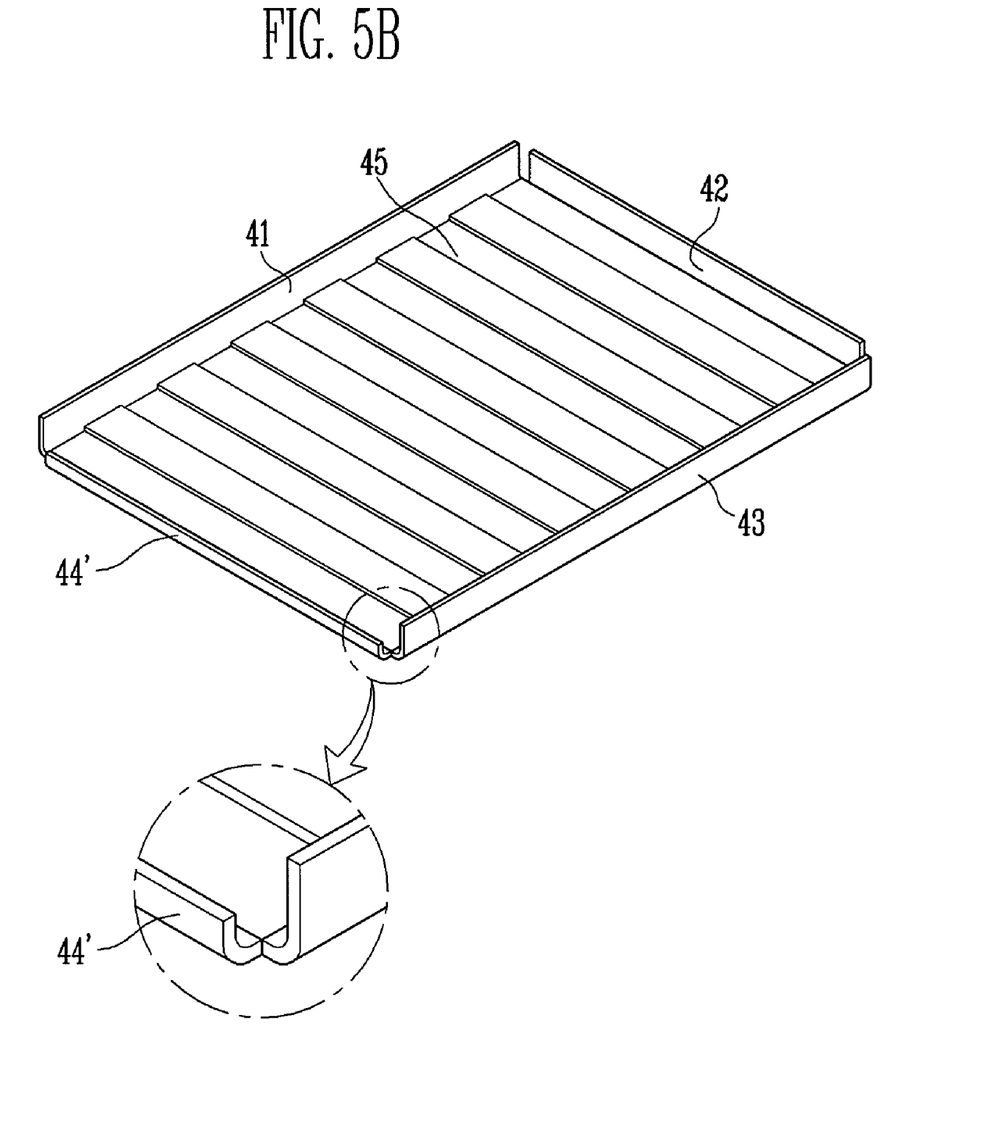
FIG. 5b is a perspective view depicting a bezel in accordance with an embodiment of the present invention.

Meanwhile, a sidewall is not formed on the bottom of the display panel for the purpose of the formation of a pad section 15; however, it is possible to form fourth sidewalls 44 and 44' as depicted in FIGS. 5a and 5b to reinforce the strength more and more. Here, the fourth sidewall 44 is formed in a predetermined region that does not shut the pad portion 15 of the display panel to be received as shown in FIG. 5a, or the fourth sidewall 44' is provided on the whole region of the bottom of the display panel lower than the height of the pad section as depicted in FIG. 5b.

Figure 6:
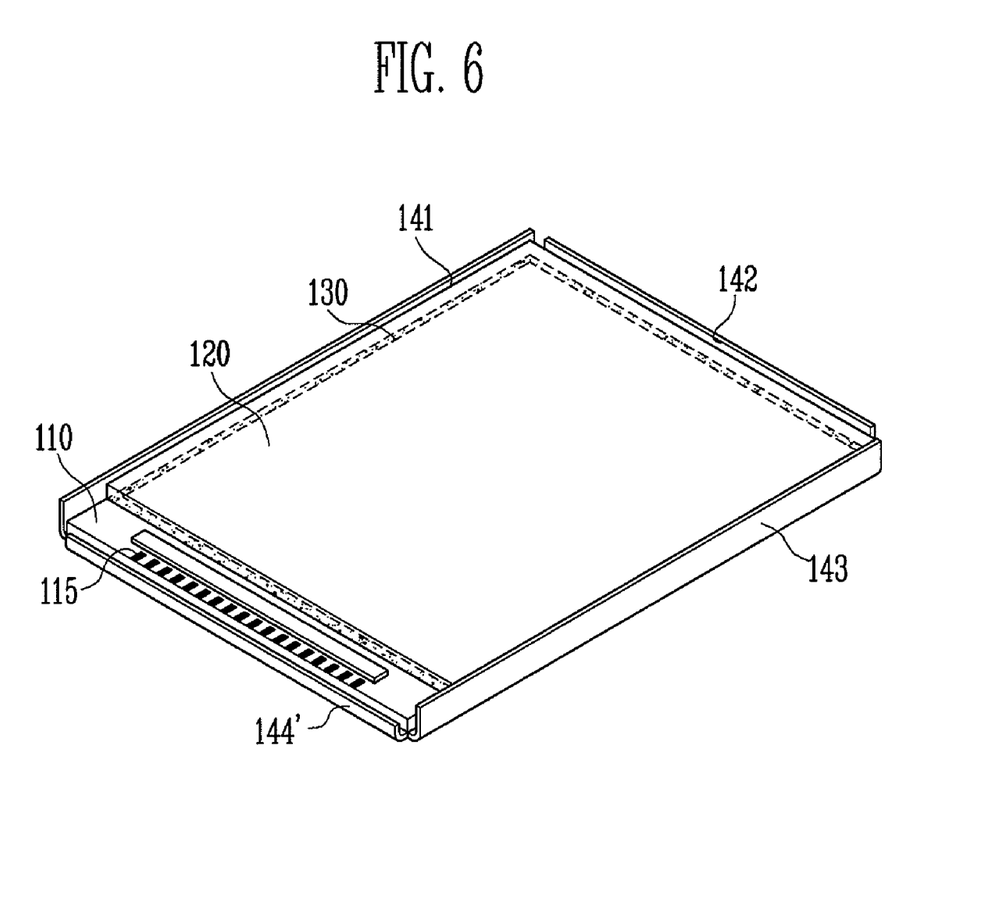
FIG. 6 is a perspective view illustrating the state where a display panel and a bezel are connected with each other in accordance with an embodiment of the present invention.

FIG. 6 is a perspective view illustrating the state where a display panel and a bezel are connected with each other in accordance with an embodiment of the present invention. The display panel is accommodated in the bezel, in which the surface of the deposition substrate of the display panel is faced with the lower surface of the bezel. Here, it is desirable that the connection between the display panel and the bezel be made with an adhesive tape or an adhesive agent of an organic material. In the structure according to the discussed embodiments, it is possible to enhance the impact resistance of the display panel sealed with an inorganic encapsulating material.

The respective sidewalls of the display panel in an embodiment correspond to a first sidewall 141, a second sidewall 142, a third sidewall 143 and a fourth sidewall 144'. The fourth sidewall 144' is formed in a height that does not shut the pad section 114.

Meanwhile, Table 1 indicates the maximum stresses applied to the substrates during the drop tests of the display panels, in which the Comparative Example did not include a concave-convex surface on the bezel and the sidewalls 141, 142 and 143 were not formed in the double-wall structure, and the Embodiment included a concave-convex surface on the bezel and the sidewalls 41, 42 and 43 were formed in the double-wall structure.

TABLE 1

| Test Region | Comparative Example Maximum Stress | Embodiment Maximum Stress | Remark |
|---|---|---|---|
| Deposition substrate | 77.82 | 99.18 | |
| Encapsulation substrate | 147.57 | 79.50 | |
| Maximum value | 147.57 | 99.18 | 32.79% reduced |

Comparing the stress levels applied to the edges of the substrate in accordance with the test results (most cracks spread from the edges of the substrates to the insides, thus causing the breakages), in the Comparative Example, the maximum stress of 77.82 MPa occurred in the deposition substrate and the maximum stress of 147.57 MPa occurred in the encapsulation substrate, whereas, in the Embodiment, the maximum stress of 99.18 MPa occurred in the deposition substrate and the maximum stress of 79.50 MPa occurred in the encapsulation substrate. Here, the maximum values applied to the overall deposition substrates were 147.6 MPa in the Comparative Example and 99.18 MPa in the Embodiment, thus reducing about 32.7%. That is, in the Embodiment, the stress value of the deposition substrate was increased; however, the maximum stress applied all over the deposition substrate was decreased to a level of 100 MPa or less, thus bringing an effect of reducing the breakage of the panel. For example, supposed that the substrate is broken at a stress value of 100 MPa, the breakage will occur in the Comparative Example, whereas, it will not occur in the Embodiment as the maximum stresses of the deposition substrate and the encapsulation substrate are smaller than 100 MPa.

Moreover, Table 2 indicates the maximum stresses applied to the substrates during the drop tests of the display panels, in which the Comparative Example did not form the sidewalls of the bezel in the double-wall structure, and the Embodiment established the sidewalls of the bezel in the double-wall structure.

TABLE 2

| Test Region | Comparative Example Maximum Stress | Embodiment Maximum Stress | Remark |
|---|---|---|---|
| Deposition substrate | 77.82 | 66.72 | |
| Encapsulation substrate | 147.60 | 114.34 | |
| Maximum value | 147.60 | 114.34 | 22.53% reduced |

It can be seen from the results of Table 2 that the maximum stress occurring in the overall edges of the substrate was reduced 22.53% in the Embodiment.

As above, embodiments of the present invention have been described and illustrated, although not limited thereto. It should be understood that various modifications and variations of the present invention can be made thereto by those skilled in the art without departing from the spirit and the scope of the present invention. For example, those modifications and variations may correspond to the depth, width and shape of the concave-convex portion of the lower surface of the bezel and the shape of the sidewalls. Thus, it is intended that the scope of the present invention covers such modifications and variations.

What is claimed is:

1. An organic light emitting display device comprising;
a display panel comprising a first substrate, a second substrate, and an array of organic light emitting pixels interposed between the first and second substrates, wherein the first substrate comprises a surface, wherein the second substrate encapsulates the organic light emitting pixels; and
a backing frame comprising a base plate and a plurality of side walls extending from edges of the base plate, wherein the base plate and the plurality of side walls in combination generally accommodate the display panel such that the first substrate opposes the base plate and the plurality of side walls surrounds edges of the display panel, wherein the base plate comprises a plurality of surfaces substantially opposing the surface of the first substrate, wherein the plurality of surfaces comprises a first surface and a second surface, wherein the first surface has a first distance to the surface of the first substrate, wherein the second surface has a second distance to the surface of the first substrate, and wherein the first and second distances are substantially different from each other.

2. The device of claim 1, wherein the first and second surfaces are substantially parallel to each other.

3. The device of claim 2, wherein the base plate further comprises a connecting surface interposed between the first and second surfaces, and wherein the connecting surface is substantially perpendicular to the first and second surfaces such that the first and second surfaces form immediately neighboring surfaces.

4. The device of claim 1, wherein the first surface is substantially parallel to the surface of the first substrate, wherein the second surface is not parallel to the surface of the first substrate, and wherein the second distance is the longest distance that the second surface has to the surface of the first substrate.

5. The device of claim 4, wherein the second surface is curved.

6. The device of claim 4, wherein the first surface immediately neighbors the second surface.

7. The device of claim 1, wherein one of the first and second surfaces contacts the first substrate.

8. The device of claim 1, wherein one of the first and second surfaces is bonded to the first substrate.

9. The device of claim 1, wherein the plurality of surfaces further comprises a first group of surfaces and a second group of surfaces, wherein each the first group of surfaces has a distance to the surface of the first substrate substantially same as the first distance, and wherein each of the second group of surfaces has a distance to the surface of the first substrate substantially same as the second distance.

10. The device of claim 9, wherein the first and second surfaces, the first group of the surfaces and the second group of surfaces are substantially parallel to one another.

11. The device of claim 10, wherein the base plate further comprises a connecting surface interposed between one of the first group of surfaces and one of the second group of surfaces, and wherein the connecting surface is substantially perpendicular to the one of the first group of surfaces and the one of the second group of surfaces such that the one of the first group of surfaces and the one of the second group of surfaces form immediately neighboring surfaces.

12. The device of claim 9, wherein the first surface and the first group of surfaces are substantially parallel to the surface of the first substrate, wherein the second surface and the second group of the surfaces are not parallel to the surface of the first substrate, wherein the second distance is the longest distance that the second surface has to the surface of the first substrate, and wherein the distance of each of the second group of the surfaces is the longest distance that each of the second group of surfaces has to the surface of the first substrate.

13. The device of claim 12, wherein the second surface and the second group of surfaces are curved.

14. The device of claim 9, wherein the first group of surfaces and the second group of surfaces are alternately arranged.

15. The device of claim 1, wherein the plurality of surfaces further comprises the plurality of third surfaces, wherein each of the plurality of third surfaces has a distance to the surface of the first substrate substantially same as the first distance, wherein the second surface is the immediately neighboring surface of each of the plurality of third surfaces.

16. The device of claim 15, wherein the first and second surfaces and the plurality of third surfaces are substantially parallel to one another.

17. The device of claim 16, wherein the base plate further comprises a connecting surface, wherein the connecting surface is interposed between the second surface and one of the plurality of third surfaces, and wherein the connecting surface is substantially perpendicular to the second surface and the one of the plurality of third surfaces such that the second surface and the one of the plurality of third surfaces form immediately neighboring surfaces.

18. The device of claim 15, wherein the plurality of third surfaces does not contact the plurality of side walls.

19. The device of claim 1, wherein the backing frame comprises a material selected from the group consisting of metal and polymeric resin.

20. The device of claim 1, wherein the plurality of side walls comprises a first side wall opposing a side of the display panel, wherein the first side wall comprises a first wall portion, a second wall portion and a connecting portion interconnecting the first and second wall portions, and wherein the first wall portion is interposed between the second wall portion and the side of display panel.

21. The device of claim 20, further comprising an intervening frame comprising an intervening portion interposed between the first side wall portion and the side of the display panel.

* * * * *

UNITED STATES PATENT AND TRADEMARK OFFICE
CERTIFICATE OF CORRECTION

PATENT NO. : 8,044,586 B2  
APPLICATION NO. : 11/670351  
DATED : October 25, 2011  
INVENTOR(S) : Wang et al.

Page 1 of 1

It is certified that error appears in the above-identified patent and that said Letters Patent is hereby corrected as shown below:

At column 1, line 46 (approx), after "frame" insert --.--.

At column 5, line 47, please delete "3-axix" and insert --3-axis--, therefor.

At column 5, line 47, please delete "4-axix" and insert --4-axis--, therefor.

At column 7, line 63 (approx), in claim 9, please delete "each the" and insert --each of the--, therefor.

Signed and Sealed this
Twenty-eighth Day of August, 2012

David J. Kappos
*Director of the United States Patent and Trademark Office*